(12) United States Patent
Higashi et al.

(10) Patent No.: US 6,937,174 B2
(45) Date of Patent: Aug. 30, 2005

(54) SAMPLING/HOLDING METHOD AND CIRCUIT

(75) Inventors: Koichi Higashi, Atsugi (JP); Kyoji Matsusako, Machida (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/701,647

(22) Filed: Nov. 5, 2003

(65) Prior Publication Data
US 2004/0130356 A1 Jul. 8, 2004

(30) Foreign Application Priority Data
Nov. 7, 2002 (JP) .................................. 2002-323757

(51) Int. Cl.[7] .............................................. H03M 1/00
(52) U.S. Cl. ..................... 341/122; 341/141; 341/159
(58) Field of Search ................................ 341/122, 123, 341/159, 172, 141, 162

(56) References Cited

U.S. PATENT DOCUMENTS 5,986,510 A * 11/1999 Graeve et al. ............. 330/295
6,166,675 A * 12/2000 Bright ........................ 341/162
6,169,751 B1 * 1/2001 Shirakata et al. .......... 370/480
2002/0106038 A1 * 8/2002 Lee et al. ................... 375/340

* cited by examiner

Primary Examiner—John B Nguyen
(74) Attorney, Agent, or Firm—Alan K. Stewart; W. James Brady, III; Frederick J. Telecky, Jr.

(57) ABSTRACT

The objective is to provide a sampling/holding circuit that can operate at high speed and low power consumption. The sampling/holding circuit has multiple sampling units 2-1~k. Each sampling unit has input terminals 1-1~k and output terminals 3-1~k. The values received at the input terminals are sampled, and the sample values are accumulated. Also, the accumulated sample values are generated at output terminals 3-1~k. One holding unit 6 has an input terminal 5 and an output terminal 7, which are shared by the multiple sampling units. By multiplexing the outputs of the multiple sampling units, multiplexing unit 4 connects any output to the input of holding unit 6. Holding unit 6 holds the sample value and generates it at output 7.

9 Claims, 11 Drawing Sheets

SAMPLING/HOLDING METHOD AND CIRCUIT

FIELD OF THE INVENTION

The present invention pertains to analog signal processing. In particular, the present invention pertains to a sampling/holding operation method and circuit suitable for applications that require high-speed operation.

BACKGROUND OF THE INVENTION

Conventionally, one stage of a sampling/holding S/H circuit is used as a circuit for sampling and holding analog signals. In the one stage of the sampling/holding circuit, a received input is sampled and held periodically. In other words, the sampling/holding S/H operation comprised of a sampling S period and holding H period that follows the sampling period is repeated for each S/H period. Consequently, when the S/H operation is executed repeatedly, the S/H period comprised of the S period and the H period is continuous in time in such a form that after one period ends, the next period starts. In that case, it is necessary to shorten each S/H period in order to speed up the S/H operation. However, in the case of shortening the holding H period, insufficient voltage convergence occurs during the holding period. On the other hand, although the voltage convergence during the holding period can be accelerated by increasing the current flowing to the amplifier concerned with the holding operation, the power consumption is increased due to the aforementioned current increase.

Also, in a pipeline A/D converter, one S/H circuit is arranged in each of the multiple A/D converting stages connected continuously in a longitudinal direction. When each converting stage receives the output as a result of the conversion processing including the S/H operation of the S/H circuit in the previous converting stage, it executes a converting operation including another S/H operation with respect to the received output. If this operation is viewed from the angle of S/H operation alone, each S/H operation occurs continuously in time in the same way as the aforementioned one-stage S/H circuit with the next S/H period starting after the end of the previous period. Consequently, the conversion time of an A/D converter including multiple A/D converting stages is basically affected by the period calculated by multiplying the S/H period by the number of stages. This causes the same problem as increasing the speed for the aforementioned one-stage S/H circuit when the speed of the conversion of the entire A/D converter is increased by shortening the S/H period in each converting stage.

SUMMARY OF THE INVENTION

In order to realize the aforementioned objective, the sampling/holding method provided by the present invention is characterized by the fact that multiple sampling/holding operations are multiplexed and executed. In a conventional S/H operation, the sampling operation and the holding operation are executed in a sampling period and a holding period with no overlap in time. No holding operation is conducted during the sampling period, and no sampling operation is conducted during the holding period. The present invention focuses on this problem.

According to the present invention, the aforementioned multiple sampling operations of the aforementioned multiple sampling/holding operations can be space division multiplexed. Also, each of the aforementioned multiple sampling/holding operations has a sampling operation and a holding operation. The aforementioned multiple holding operations of the aforementioned multiple sampling/holding operations can be time division multiplexed and executed.

Also, according to the present invention, the sampling/holding method executed in multiple sampling/holding operation phases, each of which has a sampling period for conducting the sampling operation and a holding period for conducting the holding operation has a step in which the aforementioned sampling operation is executed in the aforementioned multiple sampling/holding operation phases, and a step in which the aforementioned holding operation is time division multiplexed and executed in the aforementioned multiple sampling/holding operation phases.

According to the present invention, the aforementioned sampling operation in at least one of the aforementioned sampling/holding operation phases is executed in a period that overlaps in time with the aforementioned holding operation in another sampling/holding operation phase. In this case, the aforementioned holding operations in the aforementioned multiple sampling/holding operation phases are conducted by a common holding means.

Also, according to the present invention, the sampling operation in each of the aforementioned sampling/holding operation phases includes sampling from one input.

Or, the sampling operation in each of the aforementioned sampling/holding operation phases includes sampling from two inputs. In this case, the sampling from the aforementioned two inputs can be executed at the same time. The aforementioned two inputs can be a pair of differential inputs. The sampling from the aforementioned two inputs can also be executed at different times. In this case, the aforementioned two inputs can be a pair of differential inputs. The aforementioned pair of differential inputs can be two signal inputs obtained from one CDS signal.

Also, according to the present invention, the aforementioned multiple sampling/holding operation phases can be executed continuously in series with respect to a pair of inputs. The aforementioned multiple sampling/holding operation phases executed continuously in series can be executed in two A/D conversion stages adjacent to a pipeline A/D converter. According to the present invention, the aforementioned multiple sampling operation phases can also be executed in parallel with each other.

According to the present invention, the aforementioned holding operation can include amplification of the sample values. In this case, the aforementioned amplification may have different amplification degrees with respect to the aforementioned holding operations in the aforementioned multiple sampling/holding operation phases.

The sampling/holding circuit provided by the present invention is comprised of the following: multiple sampling means, each of which has an input and an output and samples the value received at the aforementioned input and stores the sample value and generates the stored sample value at the aforementioned output; a holding means having an input and an output; and a multiplexing means, which connects any output of the aforementioned multiple sampling means to the input of the aforementioned holding means so that the aforementioned holding means can hold the aforementioned sample value and generate it at the output of the holding means.

According to the present invention, each of the aforementioned sampling means can be comprised of a storage means and a sampling switch means for connecting the input of the aforementioned sampling means to the aforementioned storage means. Also, the aforementioned multiplexing means can include a multiplexing switch means that multiplexes the aforementioned multiple sample values obtained from the aforementioned multiple sampling means by sequentially connecting the aforementioned multiple sampling means to the aforementioned holding means one at a time.

Also, according to the present invention, each of the aforementioned multiple sampling means can be comprised of a group of sampling circuits that operate in a differential form. Also, the multiple sampling circuit groups operating in the aforementioned differential form may have one common sampling circuit. The aforementioned holding means can be comprised of a differential amplifier having two differential inputs. The aforementioned sampling circuit can be comprised of a sampling switch means and a capacitor.

According to the present invention, each of the aforementioned multiple sampling means can be made of a sampling circuit operating in a single-end form.

Also, according to the present invention, the aforementioned holding means can include an amplifying means. In this case, the aforementioned amplifying means can be made of a variable amplification means that can operate at different amplification degrees in the aforementioned holding operations in the aforementioned multiple sampling/holding operation phases. The aforementioned different amplification degrees are close to each other.

According to the present invention, the multiple inputs of the aforementioned multiple sampling means can be connected properly to receive different input signals. Or, the aforementioned multiple sampling means can be arranged sequentially. The input of the first sampling means among the aforementioned multiple sampling means is connected properly to receive an input. The input of the sampling means that follows the first sampling means is connected to the output of the aforementioned holding means. In this way, this sampling means can receive the sample value from the previous sampling means via the holding means. In this case, the number of the aforementioned sampling means can be two.

The sampling/holding circuit of the present invention can have an offset compensating means connected to the output of the aforementioned sampling means. In this case, the aforementioned offset compensating means can be made of an open loop compensating circuit or a closed loop compensating circuit. The aforementioned closed loop compensating circuit may have an input connected to the output of the aforementioned holding means.

REFERENCE NUMERALS AND SYMBOLS AS SHOWN IN THE DRAWINGS

Figure 1:
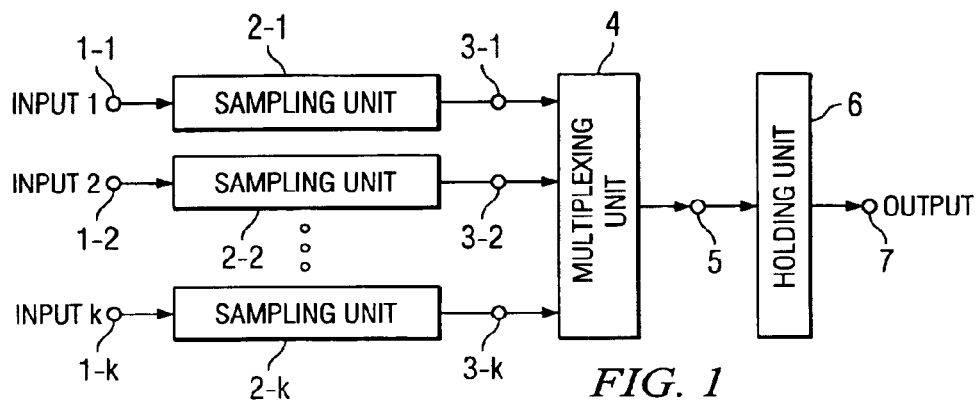
FIG. 1 is a block diagram illustrating a generalized embodiment of the sampling/holding circuit disclosed in the present invention.

In the drawing, 1 represents an input terminal of sampling unit, 2 a sampling unit, 3 an output terminal of sampling unit, 4 a multiplexing unit, 5 an input terminal of holding unit, 6 a holding unit, 7 an output terminal of holding unit, and AMP a differential amplifier.

DESCRIPTION OF THE EMBODIMENTS

In the following, various embodiments of the present invention will be explained in detail with reference to figures.

FIG. 1 shows an embodiment, wherein the sampling/holding circuit of the present invention is generalized. As shown in the figure, the sampling/holding circuit is equipped with k sampling units 2-1~k, multiplexing unit 4, and one holding unit 6. Sampling units 2-1~k have input terminals 1-1~k for receiving inputs 1~k and output terminals 3-1~k that sample the received inputs, store the sample values, and output the stored sample values, respectively. Multiplexing unit 4 has k inputs connected to output terminals 3-1~k, respectively. The multiplexing unit can select any of the k inputs in any order and connect it to its output. Holding unit 6 having its input terminal connected to the output of multiplexing unit 4 receives the sample value from one of the sampling units 2-1~k and generates an output obtained by holding that sample value at output terminal 7. Also, a storage unit used for storing the sample value, such as a capacitor, is usually included on the side of the sampling unit during sampling and included on the side of the holding unit during holding. In the specification of the present invention, however, in order to ease understanding of the explanation, such storage unit is not included on the sampling unit side or the holding unit side.

In the sampling/holding circuit shown in FIG. 1, since k sampling units 2-1~k are space division multiplexed, the entire sampling/holding circuit has k multiplexed sampling/holding operation phases. In each operation phase, one sampling/holding operation is executed by combining all k sampling units 2-1~k and one holding unit 6. Also, during each operation phase, since holding unit 6 is used in a time division multiplexing manner with respect to k sampling units 2-1~k, the holding operation in each operation phase is executed in a period that is not overlapped in time with the holding operation in another operation phase. In these multiplexed sampling/holding operation phases, because of the space division multiplexing the sampling operations of sampling units 2-1~k can be executed at the same time or not for the k sampling units. The sampling operation in each operation phase can also be executed in the holding period in another operation phase. As a result, two or more sampling/holding operations can be executed in a shorter period than with conventional technology. This has not been done in a conventional sampling/holding circuit.

The generalized sampling/holding circuit shown in FIG. 1 can have various embodiments. In other words, the circuit configuration may have an unbalanced or balanced form. The operation in the sampling/holding circuit can be a single-end operation or a differential operation. Also, the multiple sampling units can be arranged in series or in parallel in operation.

In the following, the circuit configurations of the various embodiments will be explained with reference to FIGS. 2–7. In FIGS. 2–7, for the same elements as those shown in FIG. 1, symbols "A"~"F" are added to the symbols in FIG. 1.

Figure 2:
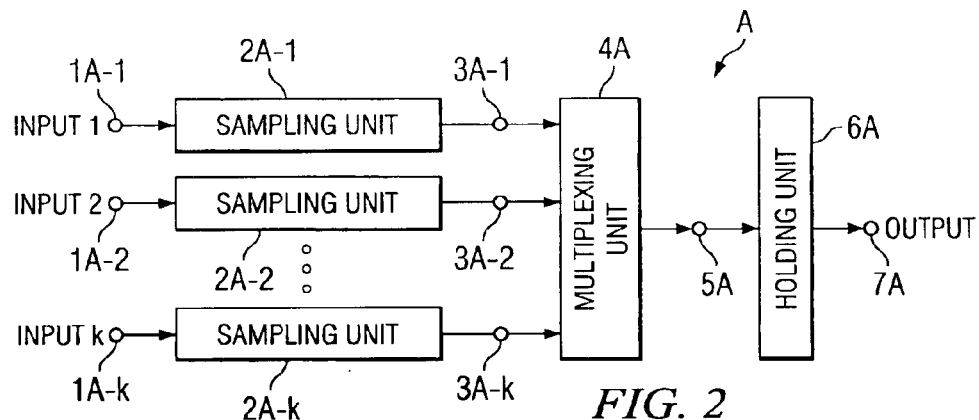
FIG. 2 is a block diagram illustrating sampling/holding circuit A in one embodiment that further embodies the embodiment shown in FIG. 1.

FIG. 2 shows sampling/holding circuit A in a first embodiment that further embodies the configuration shown in FIG. 1. The sampling/holding circuit A shown in FIG. 2 has an unbalanced, that is, single-end circuit configuration. Consequently, each of the sampling units 2-1~k shown in FIG. 1 is constituted corresponding to one of sampling circuits 2A-1~k. In this case, each sampling circuit can be comprised of a sampling switch and a capacitor used as storage unit. The multiplexing effect described with reference to FIG. 1 can also be realized in the single-end circuit configuration.

Figure 3:
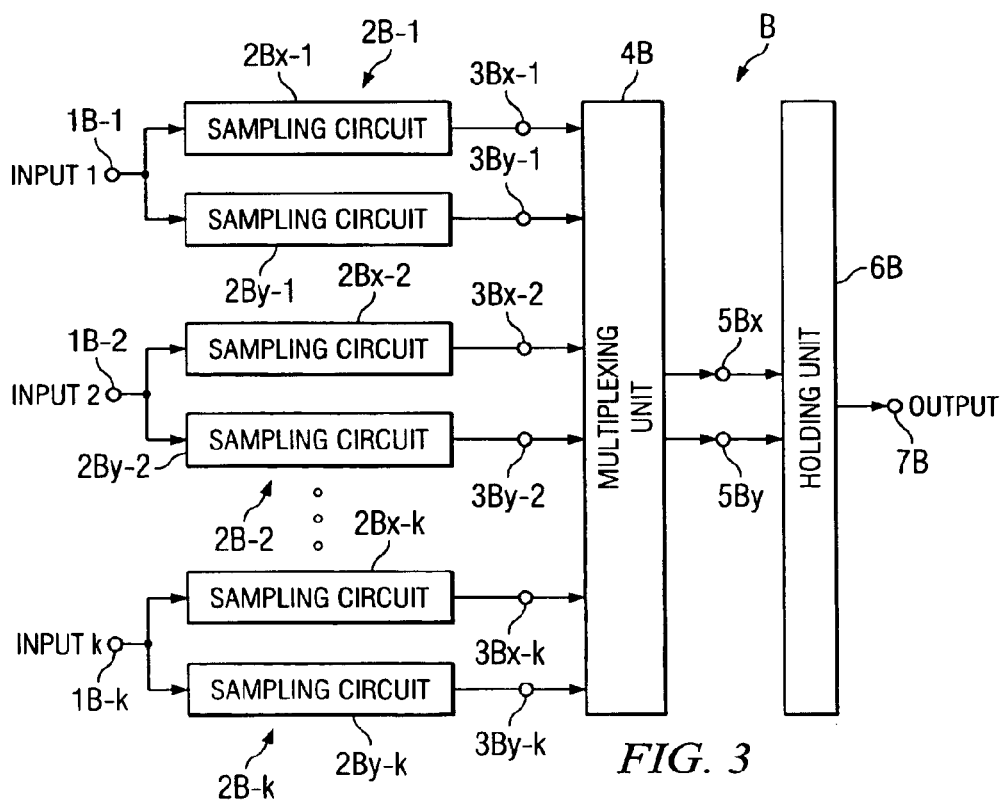
FIG. 3 is a block diagram illustrating sampling/holding circuit B in another embodiment that further embodies the embodiment shown in FIG. 1.

FIG. 3 shows sampling/holding circuit B in another embodiment that further embodies the configuration shown in FIG. 1. The circuit shown in FIG. 3 has an unbalanced circuit configuration, but the operation in the circuit is differential operation. In this circuit, two signal components (for example, a reference voltage level and an input voltage level) are included in one signal, such as a CDS (correlated double sampling) signal obtained from CCD. Such circuit is suitable for the case when the difference between the signal components is used as the data. In this case, as shown in FIG. 3, sampling units 2B-1~k corresponding to the sampling units 2-1~k shown in FIG. 1 are comprised of a pair of sampling circuits 2Bx-1 and 2By-1, 2Bx-2 and 2By-2 . . . 2Bx-k and 2By-k, respectively. Each pair of sampling circuits have one common input terminal 1B-1~k. For the purpose of differential operation, the sampling circuits have a pair of differential output terminals 3Bx-1 and 3By-1, 3Bx-2 and 3By-2 . . . 3Bx-k and 3By-k, respectively. Multiplexing unit 4B receives the outputs of k pairs of sampling circuits, selects any pair of outputs among them, and supplies them to the pair of input terminals 5Bx and 5By of holding unit 6B. Holding unit 6B outputs the held output to one output terminal 7B. This one output terminal can also be formed into one pair of differential output terminals for differential operation. In the circuit configuration shown in FIG. 3, since one pair of sampling circuits perform sampling from a signal having two signal components without overlap in time, such as a CDS signal, there is no overlapped sampling period. Also, different pairs of sampling circuits can perform sampling operations in the same period or different periods.

Figure 4:
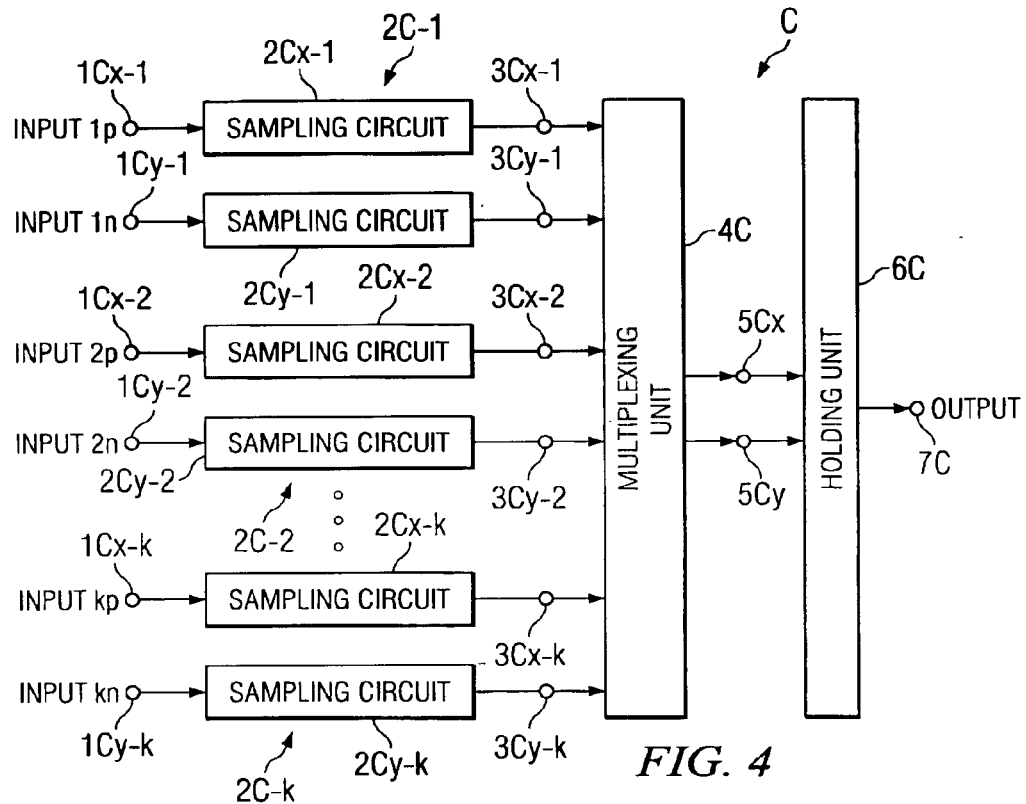
FIG. 4 is a block diagram illustrating sampling/holding circuit C in yet another embodiment that further embodies the embodiment shown in FIG. 1.

FIG. 4 shows sampling/holding circuit C in yet another embodiment that further embodies the configuration shown in FIG. 1. This circuit is similar to the circuit shown in FIG. 3. The difference is that this circuit has a balanced circuit configuration. Therefore, each pair of sample circuits 2Cx-1 and 2Cy-1 . . . 2Cx-k and 2Cy-k in sampling units 2C-1~k corresponding to the sampling units shown in FIG. 1 has a corresponding pair of input terminals 1Cx-1 and 1Cy-1 . . . 1Cx-k and 1Cy-k. In this way, one of each pair of sampling circuits (such as 2Cx-1 . . . or 2Cx-k) receives a positive differential input (corresponding to input (1p)~(kp), while the other sampling circuit (such as 2 Cy-1 . . . or 2 Cy-k) receives a negative differential input (corresponding to input 1n~kn). In this circuit, each pair of sampling circuits can also have the same or an overlapped sampling period. Also, if necessary, output terminal 7C can be formed into one pair of differential output terminals.

Figure 5:
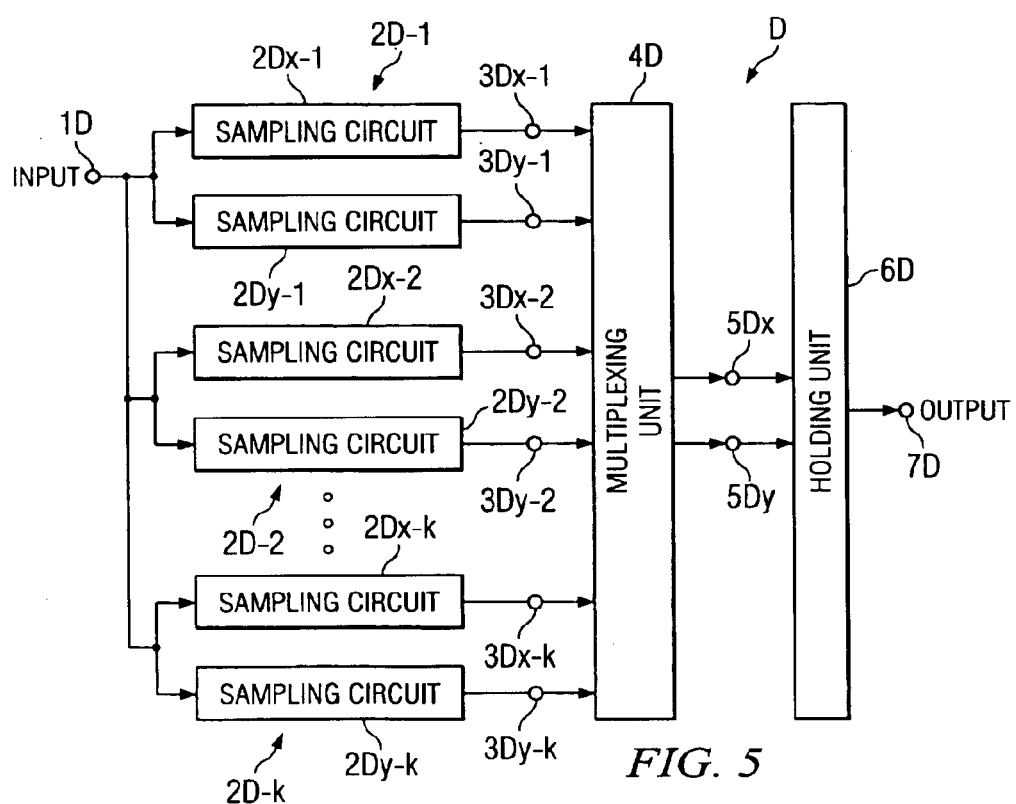
FIG. 5 is a block diagram illustrating sampling/holding circuit D in one embodiment with parallel arrangement that further embodies the embodiment shown in FIG. 1.

FIG. 5 shows sampling/holding circuit D as an embodiment of a circuit configuration with a parallel arrangement. The difference between this circuit and the circuit shown in FIG. 3 is that the input terminals of each pair of sampling circuits 2Dx-1 and 2Dy-1 . . . 2Dx-k and 2Dx-k are all connected to each other and to one input terminal 1D. Therefore, all the coupling circuits are connected in parallel, and the sampling operations are conducted in periods without overlap. As another example, the circuit configurations shown in FIGS. 2–4 may also have a parallel arrangement.

In the sampling/holding circuit shown in FIG. 4, the positive input terminals 1Cx-1~1Cx-k are connected to each other, and the negative input terminals 1Cy-1 . . . 1Cy-k are connected to each other in the same way as shown in FIG. 5. In this way, the balanced circuit configuration of the circuit shown in FIG. 5 can also be formed.

Figure 6:
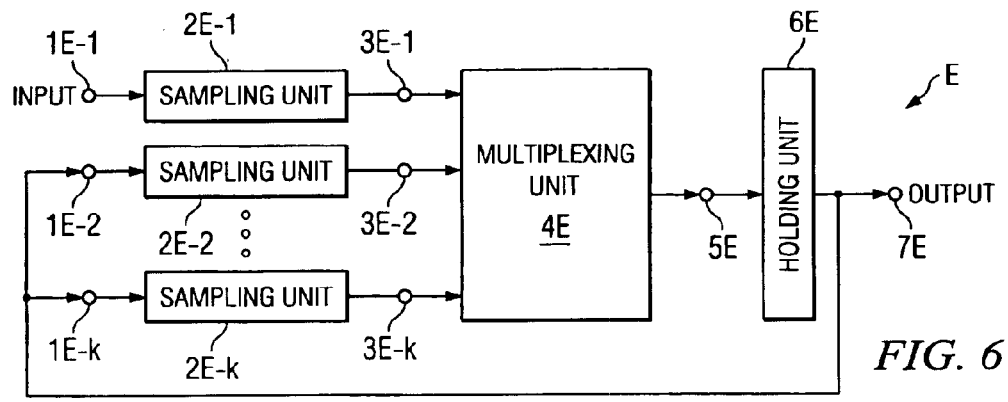
FIG. 6 is a block diagram illustrating sampling/holding circuit E in one embodiment with serial arrangement or loop arrangement that further embodies the embodiment shown in FIG. 1.

FIG. 6 shows sampling/holding circuit E as one embodiment of serial arrangement or loop arrangement. In this circuit, only the input terminals 1E-1 of the first sampling unit 2E-1 among k sampling units 2E-1~k is connected properly to receive an input. The input terminals 1E-2~k of the remaining sampling units 2E-2~k are connected to the output terminal 7E of holding unit 6E. In said sampling/holding circuit E, the next sampling unit 2E-2 receives the held sample value from the first sampling unit 2E-1 via holding unit 6E and performs another sampling/holding operation for the received sample value. Similarly, the next sampling unit 2E-3 (not shown in the figure) receives the result of this sampling/holding operation via holding unit 6E and performs yet another sampling/holding operation for it. The operation is repeated. The final sampling unit 2E-k receives an output from the holding unit and performs the final sampling/holding operation for it. The result is generated at output terminal 7E. In this way, multiple sampling/holding operations can be connected in series or in a loop by connecting multiple sampling units as described above. In the case of serial connection, when amplification or another signal processing means is added at any place in the sampling/holding circuit, such as holding unit 6E, the same signal processing can be repeated and applied to the input received at input terminal 1E-1. The signal processing applied repeatedly is not necessarily exactly the same. The applied signal processing can be varied by changing the amplification degree, etc. for each sampling/holding operation. The circuit configuration shown in FIG. 6, as to be described later, is particularly suitable for use in multiple A/D converting stages in a pipeline A/D converter.

Figure 7:
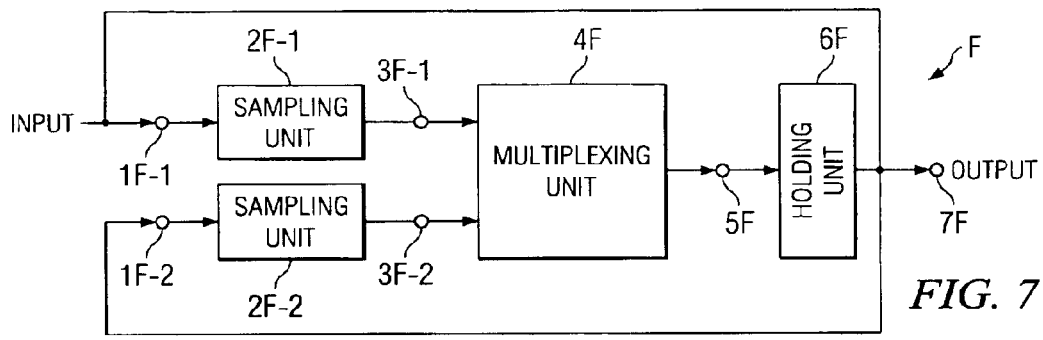
FIG. 7 is a block diagram illustrating an alternately arranged sampling/holding circuit E that simplifies the serial arrangement shown in FIG. 6.

FIG. 7 shows an alternately arranged sampling/holding circuit F obtained by simplifying the serial connection shown in FIG. 6. In this circuit, there are only two sampling units instead of k sampling units. In the arrangement shown in FIG. 7, after sampling unit 2F-1 first receives an input, sampling units 2F-1 and 2F-2 alternately receive the output of holding unit 6F regarding that input. After the sampling/holding operation is executed continuously for a prescribed number of rounds, the result is output from output terminal 7F. After that output, sampling unit 2F-1 receives a new input. In this configuration, three or more sampling/holding operations can be executed continuously by using only two sampling units.

In the following, sampling/holding circuits in various embodiments that further embody the sampling/holding circuit D shown in FIG. 5 will be explained with reference to FIGS. 8–16. These circuits correspond to those having two sampling units, that is, two pairs of sampling circuits in the circuit shown in FIG. 5. These circuits are connected to receive analog signal VIN, such as a CDS (correlated double sampling) signal input. The analog signal VIN of a CDS signal has reference voltage level Vr in the first half of one period and data voltage level Vi in the second half. The difference between these voltage levels expresses the signal, that is, the data.

Figure 8:
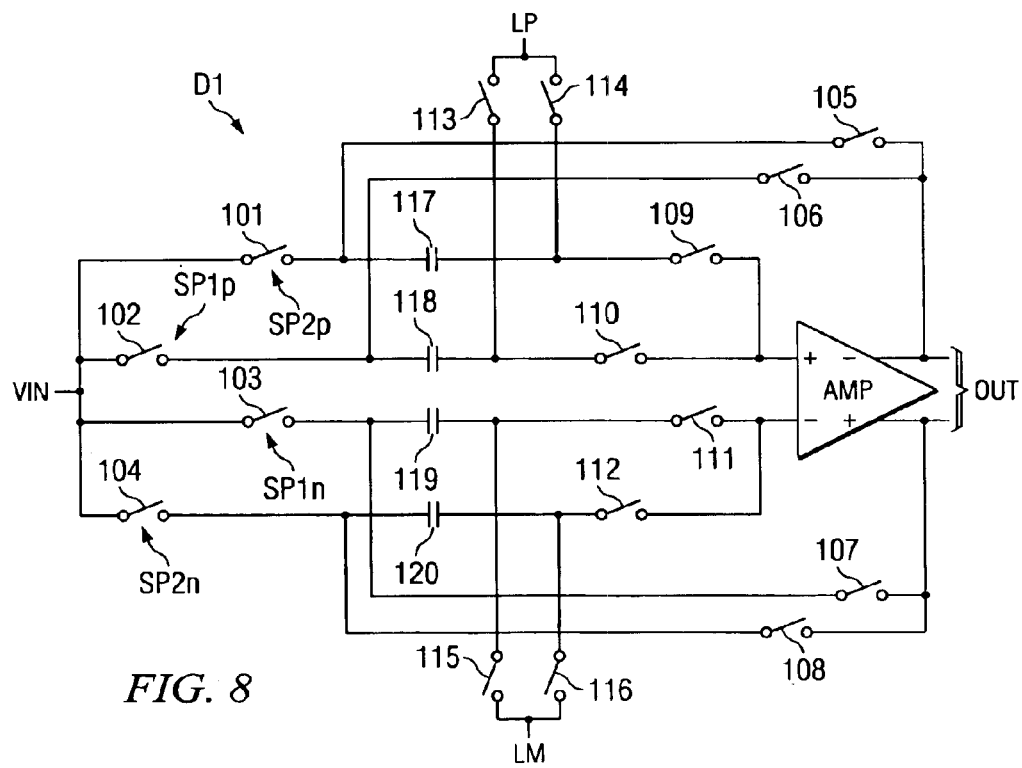
FIG. 8 is a block diagram illustrating sampling/holding circuit D1 in one embodiment that further embodies the sampling/holding circuit D shown in FIG. 5.

FIG. 8 shows sampling/holding circuit D1 as a first embodiment. In circuit D1, there are two pairs of sampling circuits that perform differential operation in two multiplexed sampling/holding operation phases, that is, the first and second phases. One pair of sampling circuits that perform differential operation, that is, the sampling circuit pair for the first sampling operation phase is comprised of one positive sampling circuit SP1p, which is comprised of capacitor 118, switch 102 (operating at sampling control clock CK1A) connected between the input and one end of capacitor 118, and switch 113 (operating at clock CK1A) connected between the other end of capacitor 118 and reference voltage LP, and one negative sampling circuit SP1n, which is comprised of capacitor 119, switch 103 (operating at sampling control clock CK2A) connected between the input and one end of capacitor 119, and switch 115 (operating at clock CK2A) connected between the other end of capacitor 119 and reference voltage LM that is more negative than reference voltage LP. Similarly, the other pair of sampling circuits that perform differential operation, that is, the sampling circuit pair for the second sampling operation phase is comprised of one positive sampling circuit SP2p, which is comprised of capacitor 117, switch 101 (operating at sampling control clock CK1B), and switch 114 (operating at clock CK1B), and one negative sampling circuit SP2n comprised of capacitor 120, switch 104 (operating at sampling control clock CK2B), and switch 116 (operating at clock CK2B) in the same circuit connection form. Also, as the multiplexing unit, in order to receive the sample value from sampling circuit SP1p, a pair of switches, that is, switch 110 (operating at hold control clock CK3A) connected between the connection point between capacitor 118 and switch 113 and the non-inverting input of a differential amplifier and switch 106 (operating at clock CK3A) connected between the connection point between capacitor 118 and switch 102 and the inverting output of the differential amplifier are used. In order to receive the sample value from sampling circuit SP1n, a pair of switches, that is, switch 111 (operating at clock CK3A) connected between the connection point between capacitor 119 and switch 115 and the inverting input of the differential amplifier and switch 107 (operating at clock CK3A) connected between the connection point between capacitor 119 and switch 103 and the non-inverting output of the differential amplifier are used. Similarly, as the multiplexing unit, in order to receive the sample value from sampling circuit SP2p, a pair of switches 109 and 105 (both of them operating at hold control clock CK3B) are used in the same connection form. Also, in order to receive the sample value from sampling circuit SP2n, a pair of switches 112 and 108 (both of them operating at clock CK3B) are used. As shown in the figure, differential amplifier AMP having an inverting output and a non-inverting output is used as the holding unit. The held output is generated between the inverting output and the non-inverting output. In this case, LP and LM represent the voltages for determining the reference voltage level (such as the voltage level of the black level). For example, if Vr=1.5 V, Vi=0.5 to 1.5 V, LM=0.5 V, LP=1.0 V can be set. In this case, the output voltage OUT(=(Vr−Vi)−(LP−LM)) of differential amplifier AMP is obtained as the differential output of OUT=(1.5−Vi)−0.5=−0.5 to 0.5.

Figure 9:
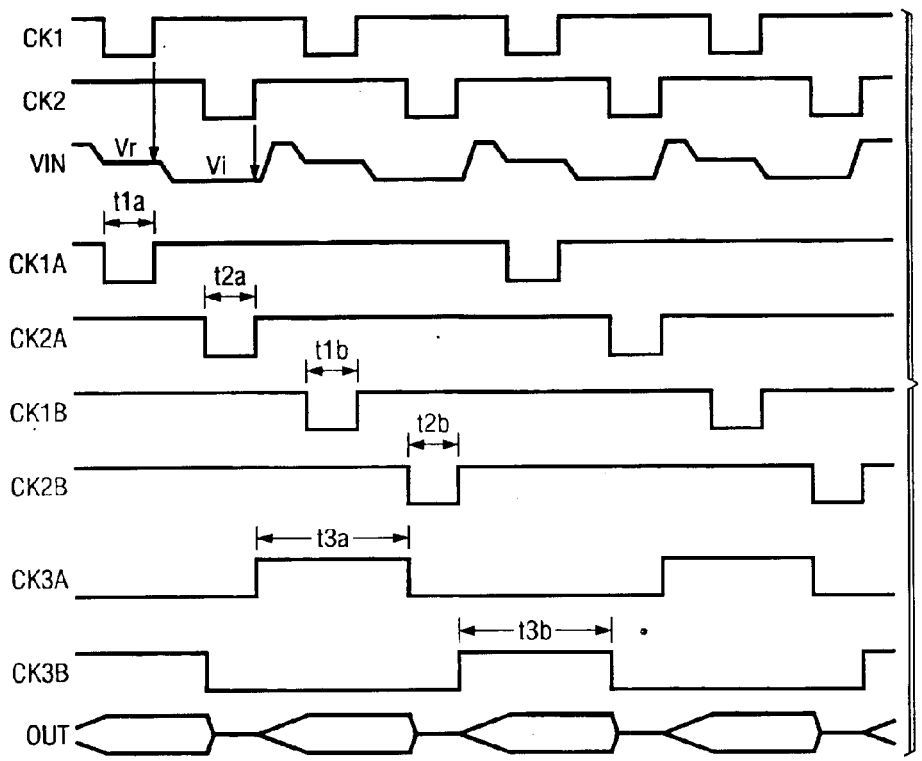
FIG. 9 is timing diagram explaining the operation of the sampling/holding circuit D1 shown in FIG. 8.

In the following, the operation of sampling/holding circuit D1 shown in FIG. 8 having the aforementioned circuit configuration will be explained with reference to FIG. 9. As shown in the figure, there are two basic clocks CK1 and CK2 for controlling the operation of the circuit. These clocks have the same period as input signal VIN. The duty ratio is 25%, and there is a 180° phase delay between them. In this way, for the low period of these two clocks, as shown in the figure, the adjacent intervals of the same period in ¼ period of the clock determine four sampling periods t1a, t2a, t1b, t2b that are ¼ period apart from each other. These sampling periods are determined by sampling control clocks CK1A, CK2A, CK1B, CK2B, respectively. In other words, clock CK1A becomes low only in the odd low periods of clock CK1, and clock CK2A becomes low only in the odd low periods of clock CK2. On the other hand, clock CK1B becomes low only in the even low periods of clock CK1, and clock CK2B becomes low only in the even low periods of clock CK2. Also, the high period of clock CK2 determines the holding period. In other words, hold control clock CK3A becomes high following the odd low periods of clock CK2, that is, becomes high in the odd high periods t3a. Hold control clock CK3B becomes high in the even high periods t3b. Two sampling/holding operation phases are determined by these clocks. One operation phase is comprised of two sampling periods and one holding period (t1a-t2a-t3a and t1b-t2b-t3b). The length of one round of the sampling/holding operation is equivalent to two periods of clock CK1.

The two sampling/holding operation phases are separated from each other by as much as one period of the basic clock CK1. Also, one holding period and one sampling period are multiplexed and overlapped in time.

In the following, the entire operation of said sampling/holding circuit D1 will be explained. In period t1a, switch 113 and switch 102 are closed by clock CK1A, and positive sampling circuit SP1p operates. The difference Vr1–LP between reference voltage Vr1 and reference voltage LP of analog signal VIN is accumulated in capacitor 118. At that time, switch 110 is open (clock CK3A is low). Then, in period t2a, switches 115 and 103 are closed by clock CK2A, and negative sampling circuit SP1n operates. The difference Vi1–LM of data voltage Vi1 and reference voltage LM of analog signal VIN is accumulated in capacitor 119. At that time, switch 111 is open (clock CK3A is low). In period t3a, switches 106, 107, 110 and 111 are closed by clock CK3A, and voltage (Vr1–Vi1)–(LP–LM) is output from differential amplifier AMP. Period t3 a can be taken from the ending edge of period t2 a to the starting edge of next period t2b. Then, in period t1b, switches 114 and 101 are closed by clock CK1B, and the other positive sampling circuit SP2p operates. The difference Vr2–LP of reference voltages Vr2 and LP of analog signal VIN is accumulated in capacitor 117. At that time, switch 109 is open (clock CK3B is low). Then, in period t2b, switches 116 and 104 are closed by clock CK2B, and the other negative sampling circuit SP2n operates. The difference Vi2–LM of data voltage Vb2 and reference voltage LM of analog signal VIN is accumulated in capacitor 120. At that time, switch 112 is open (clock CK3B is low). In period t3b, switches 105, 108, 109, and 112 are closed by clock CK3B, and voltage (Vr2–Vi2)–(LP–LM) is output from differential amplifier AMP. Period t3b can be taken from the ending edge of period t2b to the starting edge of the next period t2c.

As described above, analog signals can be input and held alternately by using two systems of capacitor groups—switch groups, that is, two sampling units, each of which is comprised of one pair of sampling circuits. Since the sampling operation in another sampling/holding operation phase can be executed in the holding period of one sampling/holding operation phase, a long holding period t3 can be guaranteed. As a result, high speed signal processing and low power consumption can be realized.

Figure 10:
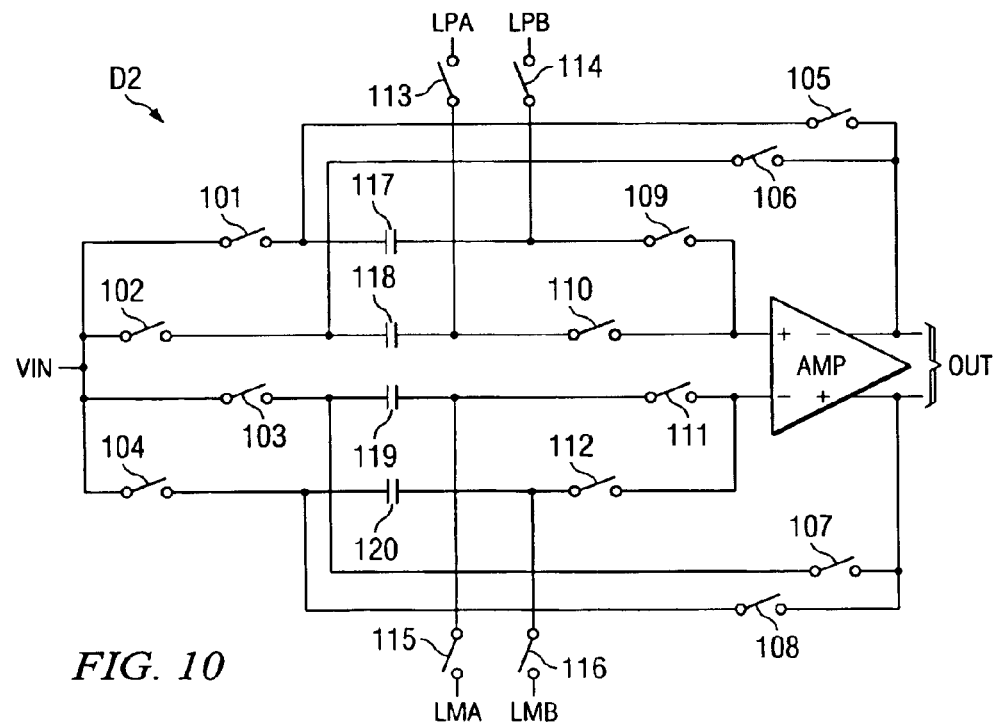
FIG. 10 is a block diagram illustrating sampling/holding circuit D2 in another embodiment that further embodies sampling/holding circuit D shown in FIG. 5 by adding closed loop offset compensation.

FIG. 10 shows sampling/holding circuit D2 of one embodiment that adds offset compensation. This circuit D2 is almost the same as that shown in FIG. 8 (the same elements are represented by the same symbols, respectively). The difference is that two other reference voltages LPA, LPB are used as the positive reference voltages, and two other reference voltages LMA, LMB are used as the negative reference voltages. This circuit configuration is desired for the case when dispersion in the held voltage, that is, accumulated voltage between the two systems, that is, two sampling units (comprised of one pair of sampling circuits), becomes a problem. This dispersion is caused by dispersions occurring between capacitors 117 and 118 or capacitors 119 and 120, switches 101 and 102, switches 103 and 104, switches 105 and 106, switches 107 and 108, switches 113 and 114, and switches 115 and 116. When the sampling/holding circuit D2 shown in FIG. 10 is used, DC offset between the held voltages can be corrected. More specifically, the DC offset voltage can be corrected by individually adjusting reference voltages LPA and LPB or reference voltages LMA and LMB.

Figure 11:
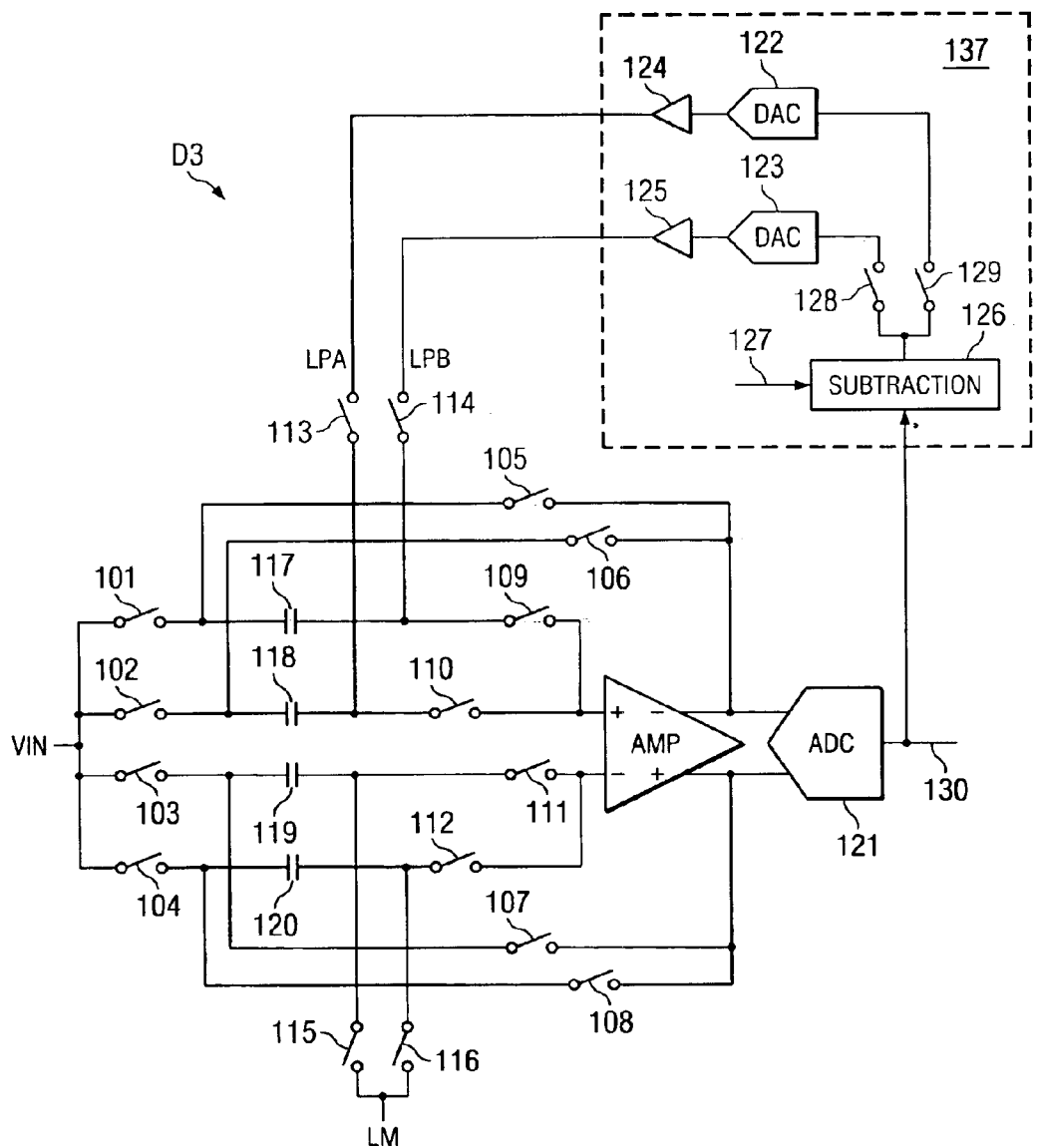
FIG. 11 is a block diagram illustrating sampling/holding circuit D3 in yet another embodiment that further embodies sampling/holding circuit D shown in FIG. 5 by adding closed loop feedback type offset compensation.

FIG. 11 shows sampling/holding circuit D3 having a closed loop feedback type offset compensating circuit. Said circuit D3 is different from the circuit shown in FIG. 10. In circuit D1 shown in FIG. 8, only the positive reference voltage is divided into two reference voltages, that is, LPA and LPB, and these two reference voltages are supplied by a closed loop feedback type offset voltage compensating circuit 137. The rest of the configuration is the same as the circuit shown in FIG. 8. Consequently, the same elements are represented by the same symbols, respectively.

More specifically, A/D converter 121 that performs A/D conversion for the output of differential amplifier AMP and offset voltage compensating circuit 137 that receives the digital output 130 of the converter are adopted. The input of offset voltage compensating circuit 137 is connected to the output of differential amplifier AMP via A/D converter 121. A/D converter 121 performs A/D conversion to convert the obtained analog voltage by sequentially outputting analog signal VIN from differential amplifier AMP in holding periods t3a, t3b, . . . (see FIG. 9) to digital output 130. Said offset voltage compensating circuit 137 receiving digital output 130 calculates the difference between A/D conversion result 130 and a prescribed reference value 127 by a subtracting means 126. The difference is connected to D/A converter 122 or 123 via switch 128 or 129. After the D/A conversion, said D/A converter 122 and 123 feed back the difference to positive reference voltages LPA and LPB supplied to the outputs of the two sampling circuits via buffers 124 and 125, respectively. In this way, the A/D conversion result 130 is controlled to be equal to said preset reference value 127. Switches 128 and 129 are controlled to close/open selectively in a period of about 10–50 pixels set in order to adjust the reference level for the CDS signal obtained from CCD display. In the period for adjusting the reference level, a reference voltage, such as a black reference level, is input as analog input signal VIN. Also, offset compensating circuit 137 stores compensation data needed for generating reference voltages LPA, LPB determined during the reference level adjusting period. After that period, reference voltages LPA, LPB are generated continuously until the next reference level adjusting period starts. In this way, offset voltage compensating circuit 137 can perform feedback to the reference voltages while supplying reference voltages LPA, LPB. Consequently, there is no need to separate the negative reference voltage into two reference voltages of LMA and LMB as shown in FIG. 10.

Figure 12:
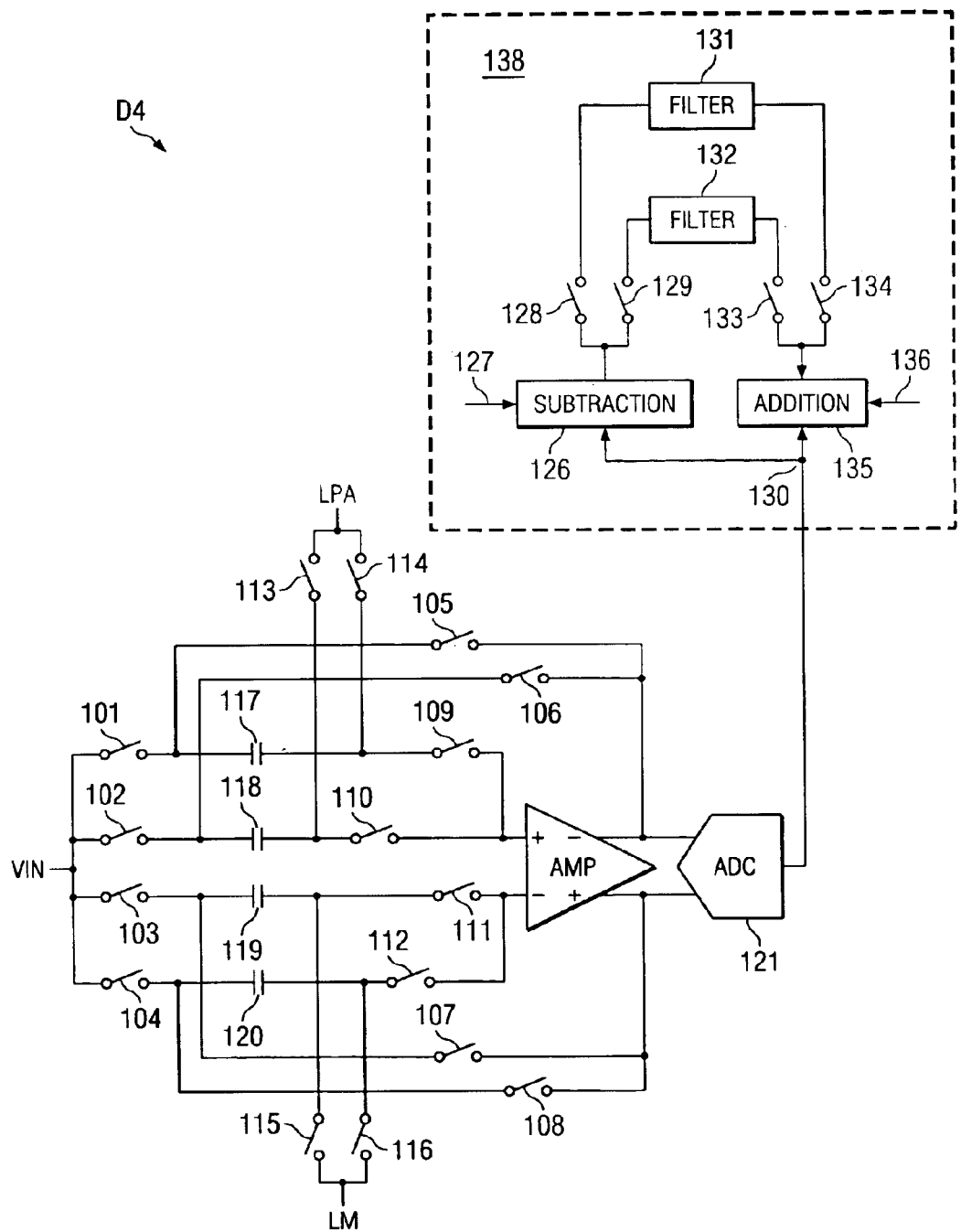
FIG. 12 is a block illustrating sampling/holding circuit D4 in yet another embodiment that further embodies the sampling/holding circuit D shown in FIG. 5 by adding open loop feed forward type offset compensation.

FIG. 12 shows sampling/holding circuit D4 having a closed loop feed forward type offset compensating circuit. This circuit D4 is different from the circuit shown in FIG. 11. For circuit D1 shown in FIG. 8, DC offset compensation is conducted by digital calculation in a feed forward form instead of the feedback form on the output side of differential amplifier AMP. Except for this, the rest of the configuration is identical to the circuits shown in FIGS. 8 and 11. Consequently, the same elements are represented by the same symbols, respectively.

More specifically, A/D converter 121 that performs A/D conversion for the output of differential amplifier AMP and offset voltage compensating circuit 138 that receives the digital output 130 of the converter are adopted. The input of offset voltage compensating circuit 138 is connected to the output of differential amplifier AMP via A/D converter 121 in the same way as shown in FIG. 11. A/D converter 121 performs A/D conversion to convert the obtained analog voltage by sequentially outputting analog signal VIN from differential amplifier AMP in holding periods t3a, t3b, . . . (see FIG. 9) to digital output 130. Said offset voltage compensating circuit 138 receiving digital output 130 calculates the difference between A/D conversion result 130 and a prescribed reference value 127 by a subtracting means 126. The difference is input to digital filter circuit 131 or 132 via switch 128 or 129. Digital filter circuit 131 or 132 performs low pass filtering or averaging for the input digital value. The result is fed forward to one input of adder 135, which receives the output of A/D converter 121 at the other input, via switch 134 or 133. As a result of the feed forward control, digital output 136 of the output of adder 135 as the A/D conversion result is controlled to be equal to preset reference value 127. In this way, the group of switch 128, filter circuit 131, and switch 134 constitutes one processing system to process signals sequentially. The group of switch 129, filter circuit 132, and switch 133 constitutes the other processing system. Said offset compensating circuit 138 itself can be adjusted during the reference level adjusting period in the same way as shown in FIG. 11.

Figure 13:
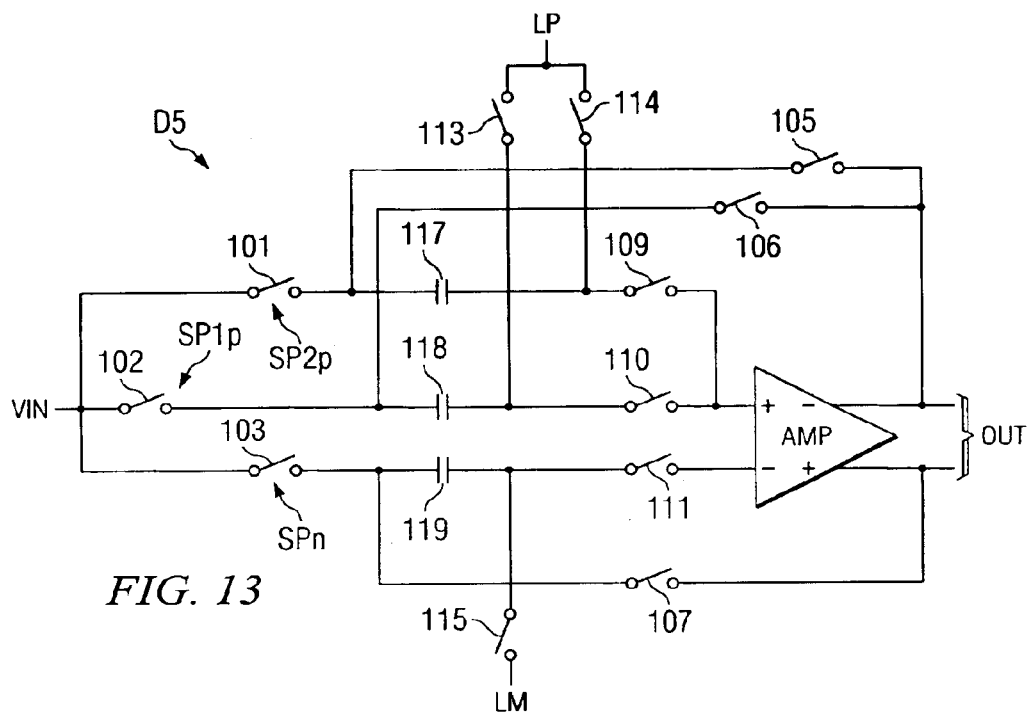
FIG. 13 is a block diagram illustrating sampling/holding circuit D5 in an embodiment that simplifies the circuit configuration of sampling/holding circuit D1 shown in FIG. 8.

FIG. 13 shows sampling/holding circuit D5 in an embodiment that further simplifies the configuration of the sampling/holding circuit D1 shown in FIG. 8. In circuit D5, as shown in the figure, two systems of sampling circuits SP1p, SP2p (capacitor and switch means) are used only for reference voltage Vr. Only one common sampling circuit Spn is set on the side of data voltage Vi. In other words, the negative sampling circuit is shared between the two pairs of positive and negative sampling circuits. Consequently, the elements equivalent to capacitor 120, and switches 104, 112, 108, and 116 in the circuit shown in FIG. 8 can be omitted. Since one sampling circuit including the capacitor for input data voltage Vi can be omitted from this circuit configuration, the circuit can be miniaturized.

Figure 14:
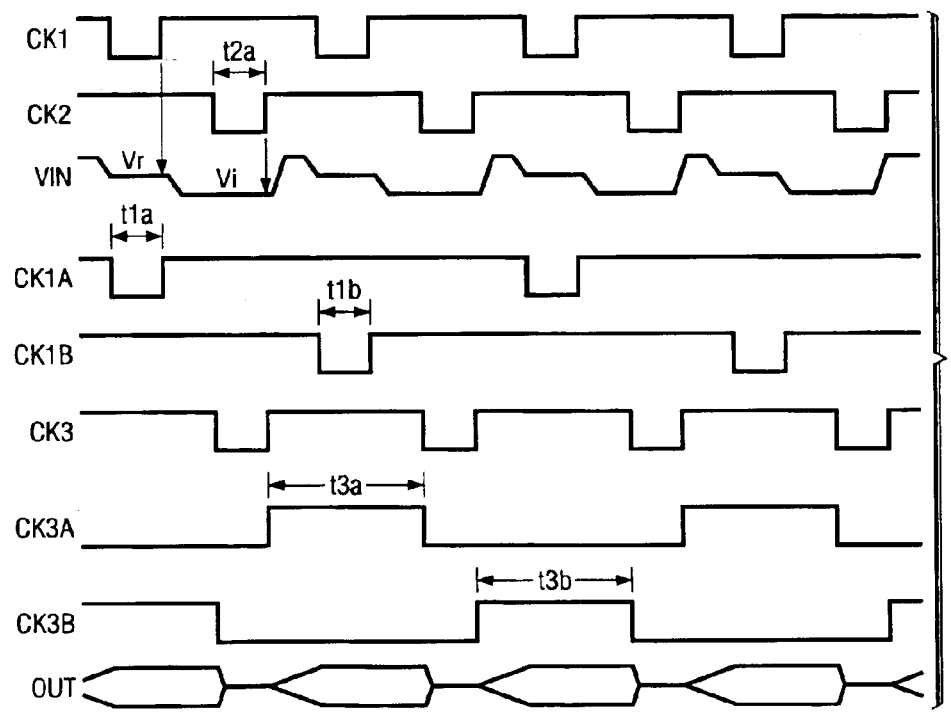
FIG. 14 is a timing diagram explaining the operation of sampling/holding circuit D5 shown in FIG. 13.

In the following, the operation of circuit D5 shown in FIG. 13 will be explained with reference to the timing diagram shown in FIG. 14. As can be seen from the figure, reference clocks CK1, CK2, CDS signal VIN, sampling control clocks CK1A, CK1B, hold control clocks CK3A, CK3B are the same as those shown in FIG. 9. The difference is that the clock CK3 for controlling the common negative sampling circuit is equivalent to reference clock CK2, that is, the combination of clocks CK2A and CK2B shown in FIG. 9 and operates sampling at a rate twice as great as clock CK2A or CK2B shown in FIG. 9. More specifically, switches 113 and 102 are controlled by clock CK1A, and switches 114 and 101 are controlled by clock CK1B. Switches 115 and 103 are also controlled by clock CK2. Also, switches 105 and 109 are controlled by clock CK3A, switches 106 and 110 are controlled by clock CK3B, and switches 107 and 111 are controlled by clock CK3. In the positive sampling period t1a in the first operation phase, when switches 113 and 102 are closed by clock CK1A=0 (low), the difference (Vr1–LP) between reference voltages Vr1 and LP of analog signal VIN is accumulated in capacitor 118. At that time, switch 110 is open. Then, in the negative sampling period t2 in the first operation phase, when switches 115 and 103 are closed by clock CK2=0, the difference (Vi1–LM) between data voltage Vi1 and reference voltage LM of analog signal VIN is accumulated in capacitor 119. At that time, switch 111 is open. In the holding period t3 a in the first operation phase, when switches 106 and 110 are closed by clock CK3A=1 (high) and switches 107 and 111 are closed by clock CK3=1, voltage (Vr1–Vi1)–(LP–LM) is output from differential amplifier AMP. In the positive sampling period t1b in the second operation phase overlapping with the holding period t3 a in the first operation phase, when switches 114 and 101 are closed by clock CK1B=0, the difference (Vr2–LP) between reference voltages Vr2 and LP of analog signal VIN is accumulated in capacitor 117. At that time, switch 109 is open. Then, in the negative sampling period t2 in the second operation phase, when switches 115 and 103 are closed by clock CK2=0, the difference (Vi2–LM) between the data voltage Vi2 and reference voltage LM of analog signal VIN is accumulated in capacitor 119. At that time, switch 111 is open. In the holding period t3b in the second operation phase, when switches 105 and 109 are closed by clock CK3B=1 and switches 107 and 111 are closed by CK3=1, voltage (Vr2–Vi2)–(LP–LM) is output from differential amplifier AMP.

In circuit D5 shown in FIG. 13, since there are only two systems for the sampling circuit with respect to the reference voltage, the clock generating circuit can be simplified, and the number of capacitors and switches can be reduced. Consequently, the chip area can be reduced. Also, the DC offset error between the two systems caused by the dispersions of the capacitors and switches between the two systems of the sampling circuits can also be reduced compared with that in circuit D1 shown in FIG. 8. In the embodiment shown in FIG. 13, two systems of sampling circuits and switches for multiplexing are used for the positive differential input. However, two systems of sampling circuits and switches for multiplexing can also be used for the negative differential input. For example, in this example it is also possible to adopt only two systems for input voltage Vi. The offset compensating circuits shown in FIGS. 10, 11, 12 can also be used in the same way for circuit D5 shown in FIG. 13.

Figure 15:
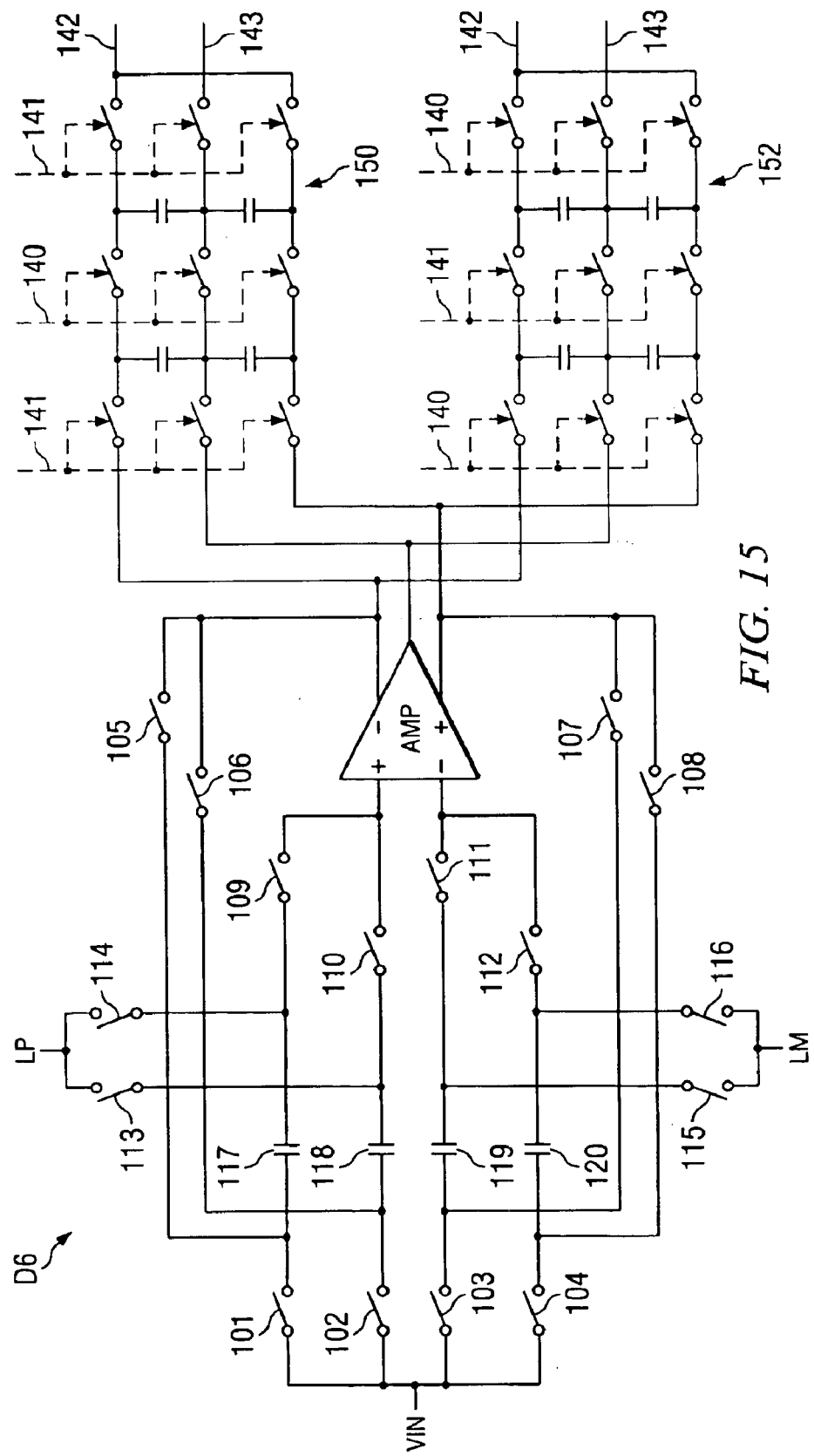
FIG. 15 is a block diagram illustrating sampling/holding circuit D6 in yet another embodiment that further embodies sampling/holding circuit D shown in FIG. 5 by using two common mode feedback circuits.

FIG. 15 shows sampling/holding circuit D6 having two common mode feedback circuits. This circuit D6 is characterized by the fact that the holding period in period t3 is extended to one period of the basic clock. In other words, common mode feedback circuit 150 for the first operation phase (at the top of FIG. 15) and common mode feedback circuit 152 for the second operation phase (at the bottom of FIG. 15) are both connected between the gate electrode, that is, the common mode terminal (not shown in the figure) of the bias current transistor of the operational amplifier that constitutes differential amplifier AMP and the inverting output and non-inverting output of the operational amplifier. In this way, the output common mode voltage of the operational amplifier can be stabilized to the desired level. The bias current transistor is used to determine the common mode voltage of the operational amplifier, and a prescribed bias voltage that controls the common mode voltage is applied to the gate electrode. Said common mode feedback circuits 150 and 152 have a conventional configuration and are arranged in such a way that two parallel connected capacitors are connected selectively between the common mode terminal and the inverting output and between the common mode terminal and the non-inverting output, respectively. The connection is established during the holding period of one of the operation phases, while the connection is cut off during the holding period of the other operation phase. In common mode feedback circuits 150 and 152, a common mode voltage is applied to terminal 142, and a bias voltage for application to the gate terminal of the bias current transistor of the operational amplifier is applied to terminal 143. The bias voltage applied to terminal 143 is adjusted to a prescribed level and then applied to the gate terminal of the bias current transistor. In this way, the common mode voltage can be controlled. Also, in feedback circuits 150 and 152, there are two groups of switches for selective connection. For signals 140, 141 that controls the two groups of switches, clock CK3A is used for signal 140, while clock CK3B is used for signal 141.

Figure 16:
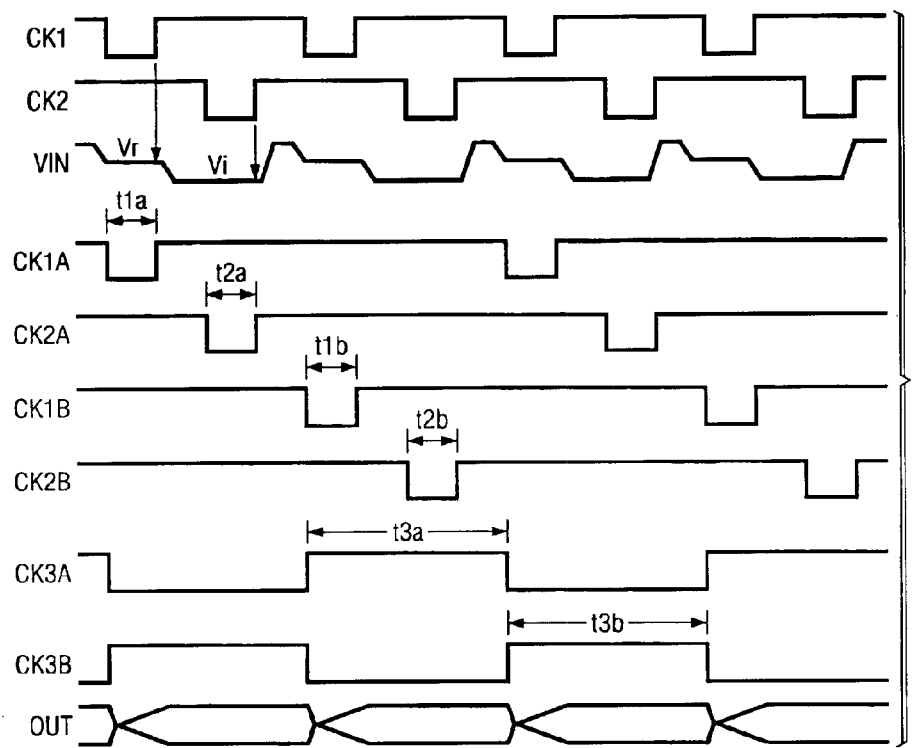
FIG. 16 is a timing diagram explaining the operation of sampling/holding circuit D6 shown in FIG. 15.

In the following, the operation of circuit D6 shown in FIG. 15 will be explained with reference to the timing diagram shown in FIG. 16. As can be seen from the figure, basic clocks CK1, CK2, and CDS signal VIN are identical to those shown in FIG. 9. Sampling control clocks CK1A, CK2A, CK1B, CK2B, and hold control clocks CK3A, CK3B are also identical to those shown in FIG. 9 and are used to control each switch shown in FIG. 15 corresponding to the respective switch shown in FIG. 8 to realize the same operation performed by the circuit shown in FIG. 8. The difference from FIG. 9 is that hold control clocks CK3A, CK3B have a duration of one period of basic clock CK1 and last from the beginning time of one of the positive sampling periods (such as t1a) of the first and second operation phases to the starting time of the other positive sampling period (such as t1b). This is different from the case shown in FIG. 9, in which the hold control period lasts ¾ period from the ending time of one of the negative sampling periods (such as t2a) of the first and second operation phases to the starting time of the other negative sampling period (such as t2b). As can be seen from FIG. 16, a pair of sampling periods and a pair of holding periods are completely multiplexed to overlap in time.

In the following, differences in the operation of sampling/holding circuit D6 will be explained in detail. When analog input VIN shown in FIG. 15 is sampled/held in two sampling/holding operation phases, depending on clock 141 for the first operation phase (that is, clock signal CK3A) and clock 140 for the second operation phase (that is, clock CK3B), the capacitor on the right side in common mode feedback circuit 150 for the first operation phase is charged during the period when the held output is generated during the holding period of the first operation phase. Then, the electric charges accumulated in the capacitor on the right side are transferred to the capacitor on the left side during the holding period of the second operation phase. If the common mode voltage comprised of the non-inverting output and the inverting output deviates from the desired common mode voltage during the holding period of the first operation phase, the difference is applied to the gate electrode of the transistor of the operational amplifier, and the common mode voltage of the held output is adjusted to the desired common mode voltage. During the period when the held output is generated during the holding period of the second operation phase, the aforementioned operation is repeated for common mode circuit 152 of the second operation phase. By using this circuit configuration, one period of holding time longer than that of the circuit shown in FIG. 8 can be guaranteed. Consequently, the speed of the sampling/holding operation can be further increased, or the power consumption can be further reduced.

In the following, sampling/holding circuit E1 in one embodiment that further embodies the serial (loop) arrangement type shown in FIG. 6 will be explained with reference to FIG. 17. This circuit E1 is suitable for executing processing in two adjacent converting stages among multiple A/D converting stages connected continuously in the longitudinal direction in the parallel A/D converter (ADC) shown in FIG. 18.

First, a conventional parallel ADC will be explained briefly with reference to FIG. 18. As shown in the figure, a parallel ADC has multiple A/D converting stages consisting of an initial stage comprised of a sampling/holding circuit SH that receives analog input IN via a capacity coupling, a second stage (stage 2), a third stage, etc. The second converting stage is comprised of an adder, an amplifier with a gain of 2, sampling/holding circuit SH, 1.5-bit flash A/D converter, and 1.5-bit D/A converter. The adder, as shown in the figure, receives the output (SH-out1) from the sampling/holding circuit SH in the previous section at the input for addition and receives the result of performing D/A conversion for the 2-bit output of the 1.5-bit flash A/D converter with the 1.5-bit D/A converter at the input for subtraction. The addition result is supplied to the sampling/holding circuit via the amplifier. The output of the sampling/holding circuit (SH-out2) is used as the input for the third converting stage. The circuit configuration of the third converting stage and thereafter is identical to that of the second stage. The A/D conversion output (comp1) of the second converting stage is generated from the output of the 1.5-bit A/D converter. Since it is necessary to add an amplifier to each converting stage in the aforementioned conventional ADC, the power consumption becomes high. On the other hand, when the resolution of the 1.5-bit ADC is increased in order to restrain the power consumption, a 4-times gain circuit is needed for the amplifier for a 2.5-bit ADC, and an 8-times gain circuit is needed for the amplifier for a 3.5-bit ADC. If the gain is expressed in decibels, in the case of a conventional pipeline ADC, the gain is 6 dB for a double gain. The gain is 12 dB for a 4-times gain. The gain is 18 dB for an 8-times gain. In order to evaluate the gain in the bandwidth of the amplifier, if the bandwidth at 0 dB is taken as 100 MHz, since the gain of the amplifier decreases at a rate of −20 dB/dec, the bandwidth becomes 53.7 MHz at 6 dB, 28.8 MHz at 12 dB, and 15.5 MHz at 18 dB. The effective bandwidth becomes narrower as the gain increases (in other words, high speed becomes more difficult to achieve). Consequently, in the circuit configuration of a conventional pipeline ADC, in order to increase the speed of the converter by increasing the effective bandwidth of the amplifier, it is necessary to reduce the capacitance of the capacitor in the sampling/holding circuit SH as the load of the amplifier and the capacitance of the capacitor in the sampling/holding circuit SH in the next stage. The reason for not reducing the capacitance until the capacitor in the next stage is that the held output is charged by the capacitor in the next stage.

Figure 18:
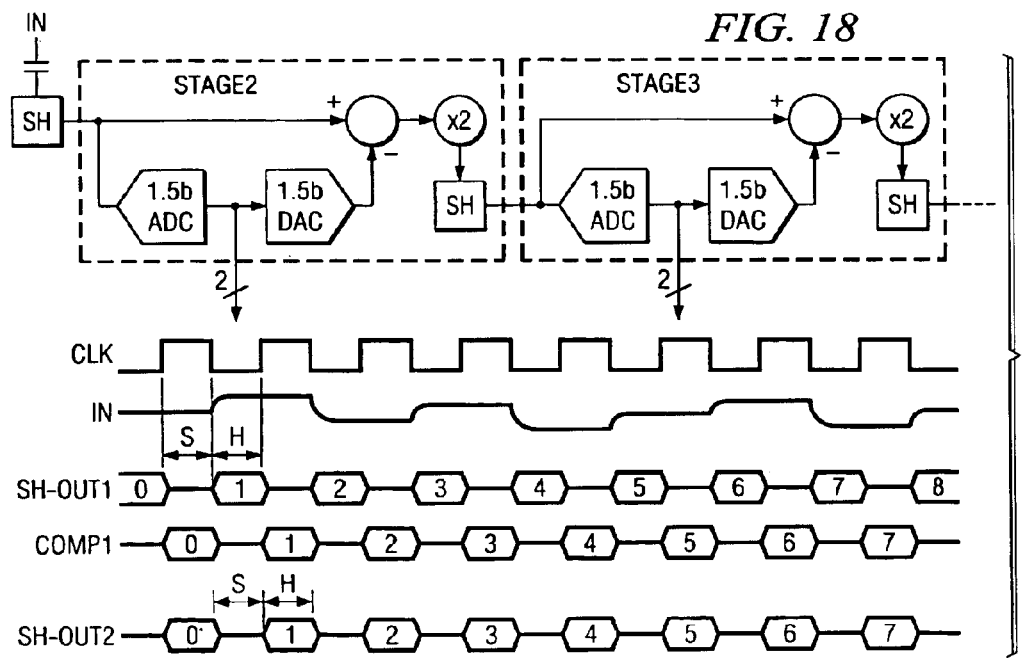
FIG. 18 is a block diagram illustrating a conventional parallel A/D converter (ADC), to which the sampling/holding circuit shown in FIG. 17 can be applied.
Figure 17:
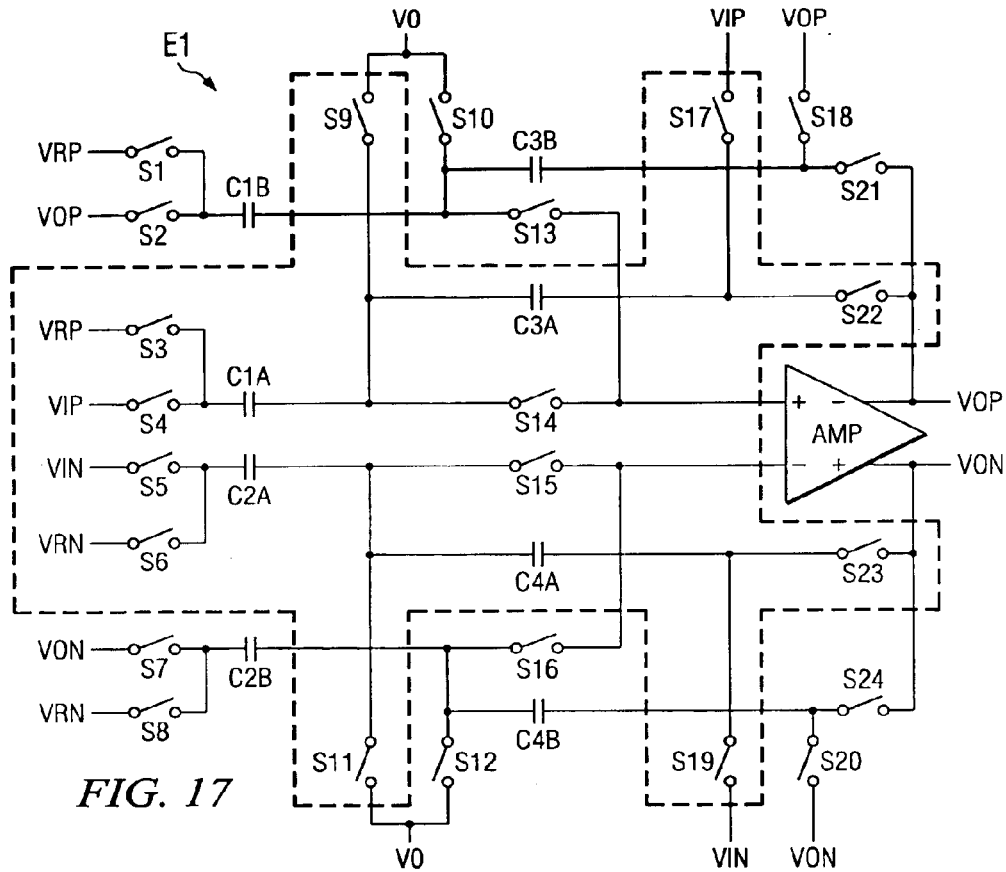
FIG. 17 is a block diagram illustrating sampling/holding circuit E1 in one embodiment that further embodies the serial (loop) arrangement type circuit shown in FIG. 6.

Sampling/holding circuit E1 of the present invention shown in FIG. 17 realizes two sampling/holding circuits SH in two adjacent converting stages (the second and third converting stages in FIG. 18) in the conventional ADC shown in FIG. 18 by using one circuit. In this way, the two sampling/holding operations in the two adjacent stages can be executed in a shorter period than that in the conventional circuit by using two multiplexed sampling/holding operation phases. Consequently, the speed of the operation of the two adjacent converting stages as a whole can be increased. Also, said sampling/holding circuit E1 may also have a circuit for realizing the subtracting function of the two adders in two adjacent converting stages in the holding period. In addition, in circuit E1 when the amplification degree of differential amplifier AMP is x2, the two amplifiers in the two adjacent converting stages can also be realized by sharing one amplifier.

In the following, explanation will be made with reference to FIG. 17. Said sampling/holding circuit E1 has a circuit used for both converting stage n and adjacent converting stage n+1. In FIG. 17, the circuit for converting stage n is encircled by the dotted line. The rest of the circuit is the circuit for converting stage n+1. Differential amplifier AMP is shared by both of the converting stages. The summary of the operation of sampling/holding circuit E1 is described as follows. In the first operation phase of the two sampling/holding operation phases, during the sampling period, differential input voltages VIP, VIN are received from the previous stage into converting stage n, and the differential voltages VRP, VRN for subtraction generated from the differential input voltages by 1.5-bit A/D converter and 1.5-bit D/A converter in converting stage n are received, followed by sampling. Then, during the holding period, in the meantime when differential voltage VRP for subtraction on the positive side is subtracted from differential input voltage VIP on the positive side, the subtraction result is held. At the same time, in the meantime when differential voltage VRN for subtraction on the negative side is subtracted from differential input voltage VIN on the negative side, the subtraction result is held. As a result, differential output voltages VOP, VON are generated. Next, in the second operation phase, during a repeated sampling period with the holding period of the first operation phase, said differential output voltages VOP, VON from converting stage n are received as differential input voltages to converting stage n+1. Also, differential voltages VRP, VRN for subtraction generated by 1.5-bit A/D converter and 1.5-bit D/A converter in converting stage n+1 from differential output voltages VOP, VON are received, followed by sampling. After that, during the holding period, in the meantime when differential voltage VRP for subtraction on the positive side is subtracted from differential output voltage VIP on the positive side used as the positive differential input voltage, the subtraction result is held. At the same time, in the meantime when differential voltage VRN for subtraction on the negative side is subtracted from differential output voltage VIN on the negative side used as the negative differential input voltage, the subtraction result is held. In this way, the output of converting stage n+1 is generated as the same differential output voltages VOP, VON.

More specifically, sampling/holding circuit E1 is equipped with one differential sampling circuit comprised of a positive sampling circuit and a negative sampling circuit in converting stage n. The positive sampling circuit is connected between the VIP input terminal and reference voltage V0 and between the VIP input terminal and the other VIP input terminal and has switch S4, capacitor C1A, switch S9, and the second capacitor C3A, switch S17. On the other hand, the negative sampling circuit is connected between the VIN input terminal and reference voltage V0 and between the VIN input terminal and the other VIN input terminal and has switch S5, capacitor C2A, switch S11, and second capacitor C4A, switch S19. Also, a common differential amplifier AMP is used as the holding unit. In addition, switches S14, S22 that connect capacitor C3A between the non-inverting input and the inverting output of the differential amplifier are arranged as the multiplexing unit on the positive side. There is also a switch S3 that connects the input terminal of capacitor C1A to VRP. On the other hand, switches S15, S23 that connect capacitor C4A between the inverting input and the non-inverting output of the differential amplifier are arranged as the multiplexing unit on the negative side. There is also a switch S6 that connects the input terminal of capacitor C2A to VRN.

Similarly, in converting stage n+1, the positive sampling circuit is connected between the VOP input terminal and reference voltage V0 and between the VOP input terminal and the other VOP input terminal and has switch S2, capacitor C1B, switch S10, and second capacitor C3B, switch S18. On the other hand, the negative sampling circuit is connected between the VON input terminal and reference voltage V0 and between the VON input terminal and the other VON input terminal and has switch S7, capacitor C2B, switch S12, and second capacitor C4B, switch S20. Also, a common differential amplifier AMP is used as the holding unit. Switches S13, S21 that connect capacitor C3B between the non-inverting input and inverting output of the differential amplifier are arranged as the multiplexing unit on the positive side. There is also a switch S1 that connects the input terminal of capacitor C1B to VRP. On the other hand, switches S16, S24 that connect capacitor C4B between the inverting input and non-inverting output of the differential amplifier are arranged as the multiplexing unit on the negative side. There is also a switch S8 that connects the input terminal of capacitor C2B to VRN.

In the following, the operation of sampling/holding circuit E1 with the aforementioned configuration will be explained in detail. When converting stage n is in a sampling operation mode and converting stage n+1 is in a holding operation mode, the on/off states of the various switches are listed below.

TABLE 1

Converting stage n → S3&S6: OFF, S4&S5: ON
    Converting stage n+1 → S1&S8: ON, S2&S7: OFF
Converting stage n → S9&S11: ON
    Converting stage n+1 → S10&S12: OFF
Converting stage n → S14&S15: OFF
    Converting stage n+1 → S13&S16: ON
Converting stage n → S17&S19: ON
    Converting stage n+1 → S18&S20: OFF
Converting stage n → S22&S23: OFF
    Converting stage n+1 → S21&S24: ON When connection is made in this way, in the first operation phase, during the sampling period, differential input voltages VIP, VIN as well as the differential voltages VRP, VRN for subtraction are received from the previous stage to converting stage n, followed by sampling.

On the other hand, when converting stage n is in the holding operation mode and converting stage n+1 is in the sampling operation mode, the on/off states of the various switches are inverted and listed as follows.

TABLE 2

Converting stage n → S3&S6: OFF, S4&S5: OFF
    Converting stage n + 1 → S1&S8: OFF, S2&S7: ON
Converting stage n → S9&S11: OFF
    Converting stage n + 1 → S10&S12: ON
Converting stage n → S14&S15: ON
    Converting stage n + 1 → S13&S16: OFF
Converting stage n → S17&S19: OFF
    Converting stage n + 1 → S18&S20: ON
Converting stage n → S22&S23: ON
    Converting stage n + 1 → S21&S24: OFF As a result, in the first operation phase, during the holding period, in the meantime when differential voltage VRP for subtraction on the positive side is subtracted from differential input voltage VIP on the positive side, the subtraction result is held. At the same time, in the meantime when differential voltage VRN for subtraction on the negative side is subtracted from differential input voltage VIN on the negative side, the subtraction result is held. In this way, differential output voltages VOP, VON are generated. Also, in the sampling period in the second operation phase that occurs at the same time, the differential output voltages VOP, VON transmitted from converting state n as the differential input voltages to converting stage n+1 are sampled. Also, the holding operation in the second operation phase is executed at the same time as the sampling operation of the first operation phase in the newly started cycle of two sampling/holding operation phases. After that, the operation is repeated in the same way as described above. As described above, sampling/holding circuit E1 shown in FIG. 17 has a balanced configuration, simultaneous sampling, differential operation, and a serial arrangement.

Figure 19:
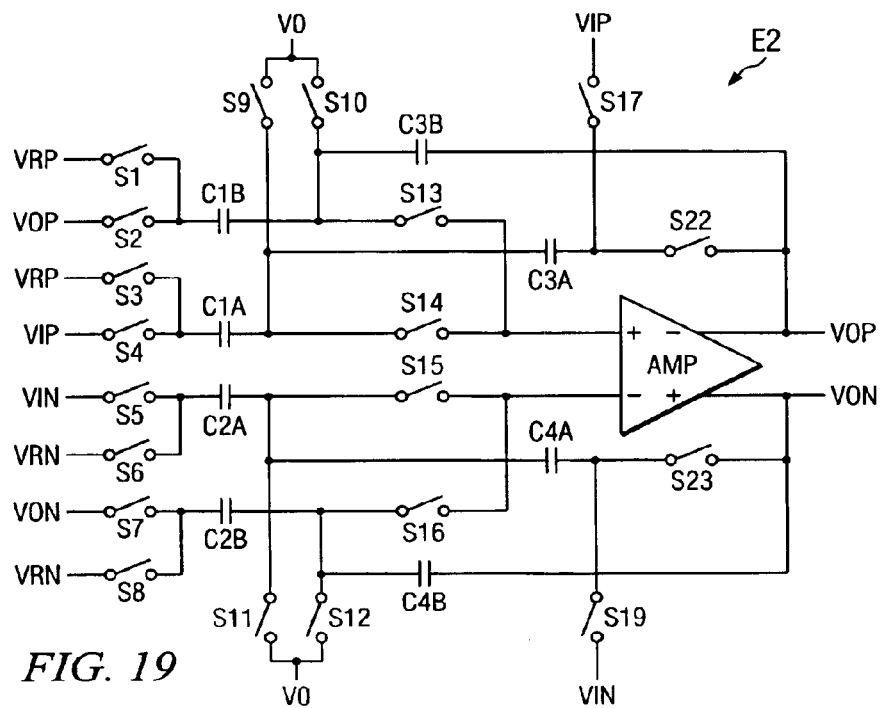
FIG. 19 is a block diagram illustrating sampling/holding circuit E2 in an embodiment that simplifies part of the sampling/holding circuit E1 shown in FIG. 17.

FIG. 19 shows sampling/holding circuit E2 in an embodiment that simplifies part of sampling/holding circuit E1 shown in FIG. 17. Circuit E2 is almost identical to circuit E1 shown in FIG. 17 (the same elements are represented by the same symbols, respectively). The difference is that switches S18, S21, S20, S24 used for preventing charge injection noise in the circuit shown in FIG. 17 are omitted. The operation can be effectively executed depending on the application even if these switches are omitted.

Figure 20:
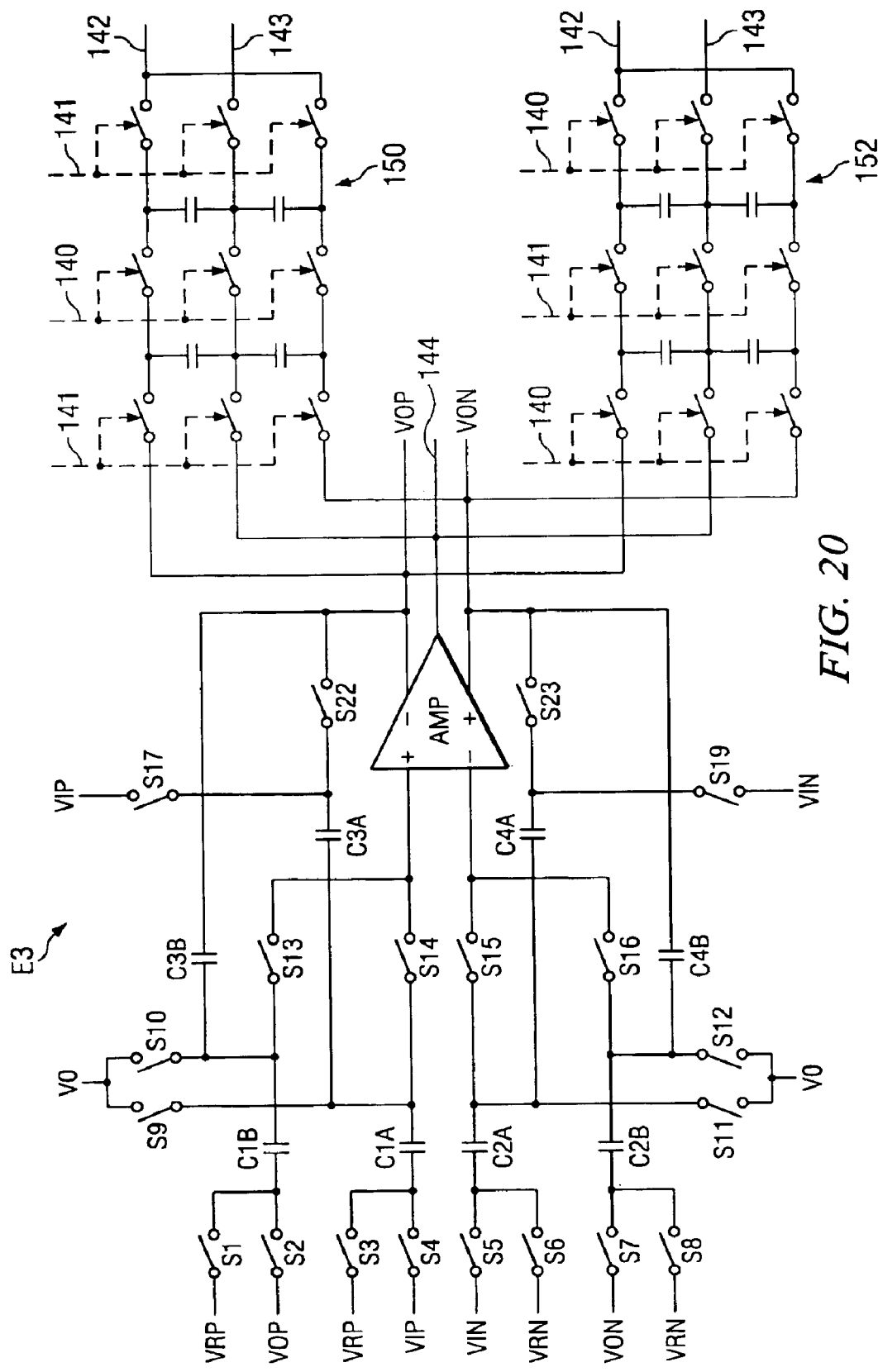
FIG. 20 is a block diagram illustrating sampling/holding circuit E3 in one embodiment that adopts the same common mode feedback circuits as those shown in FIG. 15 with respect to the sampling/holding circuit shown in FIG. 19.

Finally, FIG. 20 shows sampling/holding circuit E3 in an embodiment that adopts the same common mode feedback circuits 150, 152 as those shown in FIG. 15 for the sampling/holding circuit E2 shown in FIG. 19. The rest of the elements are exactly the same as those in circuit E2 shown in FIG. 19. Common mode feedback circuits 150, 152 have been explained with reference to FIG. 15. Said circuit E3 can be used to adjust the output voltage of differential amplifier AMP to any level.

In the sampling/holding circuits shown in FIGS. 15, 17, 19, and 20, each pair of the two pairs of VRP terminals and VRN terminals are connected to the output of the 1.5-bit D/A converter in each converting stage. In these embodiments, however, it is also possible to use two reference voltages V0, V1 instead of one reference voltage V0 and constitute each of the four capacitors C1A, C2A, C1B, C2B with four capacitors and use these four capacitors alternately.

Various modifications can be made to the embodiments of the present invention explained above. First of all, in the embodiments shown in FIGS. 8–20, the sampling/holding operation itself is a differential operation even if the circuit configuration is unbalanced. However, the present invention can also be applied to the case when the sampling/holding operation itself is a single-end operation. Second of all, in each of the embodiments described above, no special explanation is given to the gain of the differential amplifier, which is the same throughout different sampling/holding operation phases. If necessary, however, the gain setting circuit of the differential amplifier can also be switched to set a different gain so that there is a specific gain for a specific sampling/holding operation phase. For example, when the sampling/holding circuit shown in FIG. 17 is used for the parallel ADC shown in FIG. 18, the gain of the differential amplifier AMP for the first operation phase and the gain for the second operation phase can be set differently. When these gains are kept at the same or close values between adjacent converting stages, the speed of the differential amplifier can be averaged for the two converting stages as a whole. Third of all, the embodiments shown in FIGS. 17–20 pertain to a pipeline ADC. The present invention, however, can also be applied in the same way to any other form of A/D converter with the A/D converting stages connected continuously in the longitudinal direction.

As described above, according to the present invention, when sampling/holding operations are multiplexed, multiple sampling/holding operations can be executed in a shorter period than that in conventional technology. Consequently, the speed of the sampling/holding operation itself or a processing using such operation can be increased. Also, when the sampling/holding operations are multiplexed, even if the same sampling/holding period as that in conventional technology is provided, a longer holding period than that in the conventional technology can be obtained. In this way, the power consumption can be reduced, or the held output can be stabilized.

What is claimed is:

1. A sampling/holding method comprising:
   executing a sampling/holding operation in multiple sampling/holding operation phases, each of which has a sampling period for conducting a sampling operation and a holding period for conducting a holding operation; and
   executing the sampling operation during the multiple sampling/holding operation phases,
   executing the holding operation during the multiple sampling/holding operation phases, wherein the holding operation is time division multiplexed, and
   the sampling operation in at least one of the sampling/holding operation phases is executed in a period that is overlapped in time with the holding operation in another sampling/holding operation phase.

2. The sampling/holding method described in claim 1 wherein
   the holding operations in the multiple sampling/holding operation phases are conducted by a common holding means.

3. The sampling/holding method described in claim 1 wherein
   the sampling operation in each of the sampling/holding operation phases includes sampling from one input.

4. The sampling/holding method described in claim 1 wherein
   the sampling operation in each of the sampling/holding operation phases includes sampling from two inputs.

5. The sampling/holding method described in claim 4 wherein
   the sampling from the two inputs is simultaneously executed.

6. The sampling/holding method described in claim 5 wherein
   the two inputs are a pair of differential inputs.

7. The sampling/holding method described in claim 4 wherein
   the sampling of the two inputs is not simultaneously executed.

8. The sampling/holding method described in claim 1 wherein
   the multiple sampling/holding operation phases are executed continuously in series with respect to a pair of inputs.

9. The method described in claim 1 wherein
   the multiple sampling operation phases are executed in parallel with each other.

* * * * *